United States Patent

[11] 3,582,807

[72] Inventor John L. Addis
Portland, Oreg.

[21] Appl. No. 845,471
[22] Filed July 28, 1969
[45] Patented June 1, 1971
[73] Assignee Tektronix, Inc.
Beaverton, Oreg.

[54] AMPLIFIER GAIN CONTROL CIRCUIT INCLUDING DIODE BRIDGE
9 Claims, 3 Drawing Figs.

[52] U.S. Cl. .......... 330/145, 330/15, 330/29
[51] Int. Cl. .......... H03g 3/20
[50] Field of Search .......... 330/29, 144, 145, 15, 118, 120; 325/414

[56] References Cited

UNITED STATES PATENTS

| | | | |
|---|---|---|---|
| 2,784,263 | 3/1957 | Curry et al. | 330/145X |
| 3,351,867 | 11/1967 | Jauernik | 330/29UX |

FOREIGN PATENTS

| | | | |
|---|---|---|---|
| 835,307 | 5/1960 | Great Britain | 330/144 |

*Primary Examiner*—Roy Lake
*Assistant Examiner*—James B. Mullins
*Attorney*—Buckhorn, Blore, Klarquist and Sparkman

ABSTRACT: A gain control circuit for a DC coupled wide-band amplifier is described in which a diode bridge is employed to adjust the gain by providing a variable resistance between bridge outputs connected to such amplifier whose value changes with bias current flowing through such bridge. Bias current for the diode bridge is varied by changing the bias voltages applied to two bias resistors at inputs on opposite sides of such bridge, equally in opposite directions with respect to the quiescent DC voltage of the bridge outputs. This is achieved by an operational amplifier having an input connected to one side and its output connected to the other side of the bridge and a reference voltage on its other input equal to the DC voltage on the bridge outputs to maintain the bias current in the two bias resistors equal. Two of the bridge diodes are of much larger junction area than the other two diodes to improve the linearity of the bridge resistance. A push-pull amplifier using the gain control diode bridge had a frequency response of DC to 630 megahertz and a rise time of 0.55 nanoseconds.

JOHN L. ADDIS
*INVENTOR*

*BY*
*BUCKHORN, BLORE, KLARQUIST & SPARKMAN*
*ATTORNEYS*

AMPLIFIER GAIN CONTROL CIRCUIT INCLUDING DIODE BRIDGE

BACKGROUND OF INVENTION

The subject matter of the present invention relates generally to gain control circuits for DC coupled amplifiers of wide-band frequency response. In particular, the invention relates to the use of a diode bridge as a variable resistance gain control to enable an extremely high frequency response up to about 1,000 megahertz due to the low series inductance and low shunt capacitance associated with the bridge resistance. The present gain control circuit is especially useful in the vertical amplifier of a cathode ray oscilloscope and one such amplifier has been built having a frequency response of DC to 630 megahertz and a rise time of 0.55 nanoseconds.

In addition to its wide-band frequency response, the gain control circuit of the present invention has the advantage that the resistance of the bridge is controlled electronically by adjustment of the bias current supplied therethrough so that the gain adjustment knob can be located at a position remote from the bridge such as on the front panel of the oscilloscope. The diode bridge also provides a larger range of resistance variation than that of a conventional potentiometer ordinarily used as a gain control. In order to improve the linearity of the bridge resistance, two of the bridge diodes are made with rectifying junctions of larger area than the other diodes. Schottky barrier diodes having metal to semiconductor rectifying junctions are employed in the bridge because of their low charge storage.

Previous amplifier gain controls have conventionally been in the form of variable resistors of one type or another, such as potentiometers, which have a relatively large series inductance and shunt capacitance associated with such resistor thereby limiting the high frequency response of the amplifier. Furthermore, in these prior art circuits, the gain adjustment resistance is varied mechanically so that any knob or other adjustment means positioned remote the variable resistor must be coupled thereto by a long and bulky control shaft. The above problems are overcome by the gain control circuit of the present invention.

It is therefore one object of the present invention to provide an improved amplifier gain control of wide-band frequency response which is adjusted electronically.

Another object of the invention is to provide an improved amplifier gain control in which a diode bridge is employed as a variable resistance which is adjusted over a wide range by varying the bias current flowing through the diodes of such bridge.

A further object of the present invention is to provide an improved amplifier gain control circuit including a diode bridge in which two of the diodes are formed with rectifying junctions of larger area than the other two diodes to improve the linearity of the bridge resistance.

Still another object of the present invention is to provide an improved DC coupled wide-band amplifier including a gain control circuit employing a diode bridge to provide a variable resistance with low associated series inductance and shunt capacitance to enable the amplifier to have a high frequency response.

Other objects and advantages of the present invention will be apparent from the following detailed description of a preferred embodiment thereof and from the attached drawings of which:

DESCRIPTION OF PREFERRED EMBODIMENT

Figure 1:
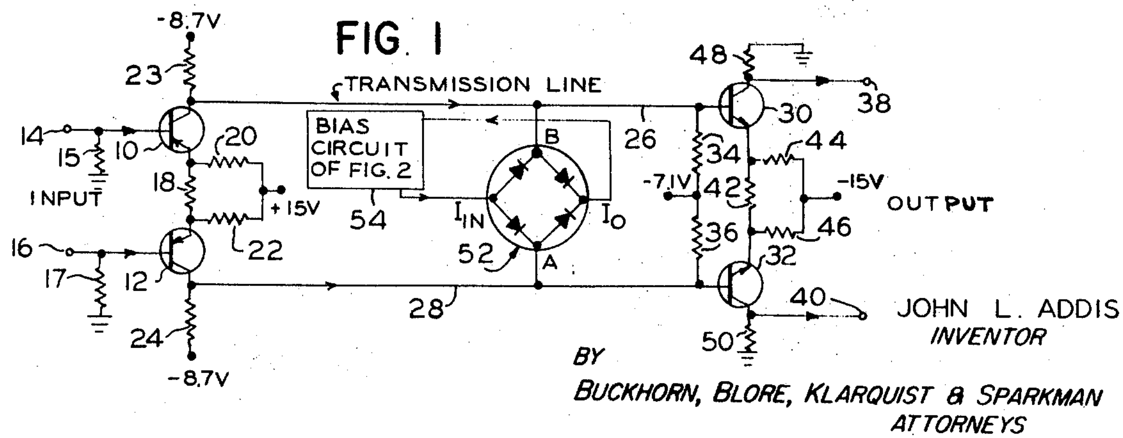
FIG. 1 is a schematic diagram of an amplifier employing the gain control circuit of the present invention.

A DC coupled wide-band push-pull amplifier suitable for use as the vertical amplifier of a cathode ray oscilloscope and employing the gain control circuit of the present invention is shown in FIG. 1. The amplifier includes a pair of PNP-type input transistors 10 and 12 having their bases connected respectively to vertical signal input terminals 14 and 16 and to ground through bias resistors 15 and 17. The emitters of the input transistors 10 and 12 are connected together through a coupling resistor 18 and are connected to a source of positive DC supply voltage of +15 volts through bias resistors 20 and 22. The collectors of the input transistors 10 and 12 are each connected to a source of negative DC supply voltage of −8.7 volts through load resistors 23 and 24 respectively. The push-pull outputs at the collectors of transistors 10 and 12 are connected through lines 26 and 28 respectively to the push-pull inputs at the bases of a pair of NPN-type output transistors 30 and 32. The two lines 26 and 28 form a transmission line of uniform characteristic impedance $Z_0$ which is equal to twice the resistance of the load resistors 23 and 24 connected to its input so that such load resistors together terminate the input end of such line in its characteristic impedance to prevent signal reflections therefrom which tend to cause distortion of the signal. It should be noted that the transmission line may also be of an artificial or lumped constant type with individual inductors and capacitors (not shown).

A pair of base bias resistors 34 and 36 of the same value as load resistors 23 and 24 of for example 80 ohms each are connected at one terminal to the output ends of lines 26 and 28 as well as to the bases of output transistors 30 and 32 respectively, and at their other terminal to a source of negative DC supply voltage of −7.1 volts. These resistors serve not only as base bias resistors but also as termination resistors for the output end of the transmission line 26, 28 which may have a characteristic impedance of 160 ohms.

The output stage of the amplifier including output transistors 30 and 32 transmits the push-pull input signal to output terminals 38 and 40 connected to the collectors of such transistors as a push-pull output signal of the same polarity as the input signal applied to input terminals 14 and 16 since it is inverted twice by the input and output transistors. The output transistors 30 and 32 have their emitters connected together through a coupling resistor 42 and connected through bias resistors 44 and 46 to a source of negative supply voltage of −15 volts, while the collectors of such transistors are connected to ground through load resistors 48 and 50.

Figures 2, 3:
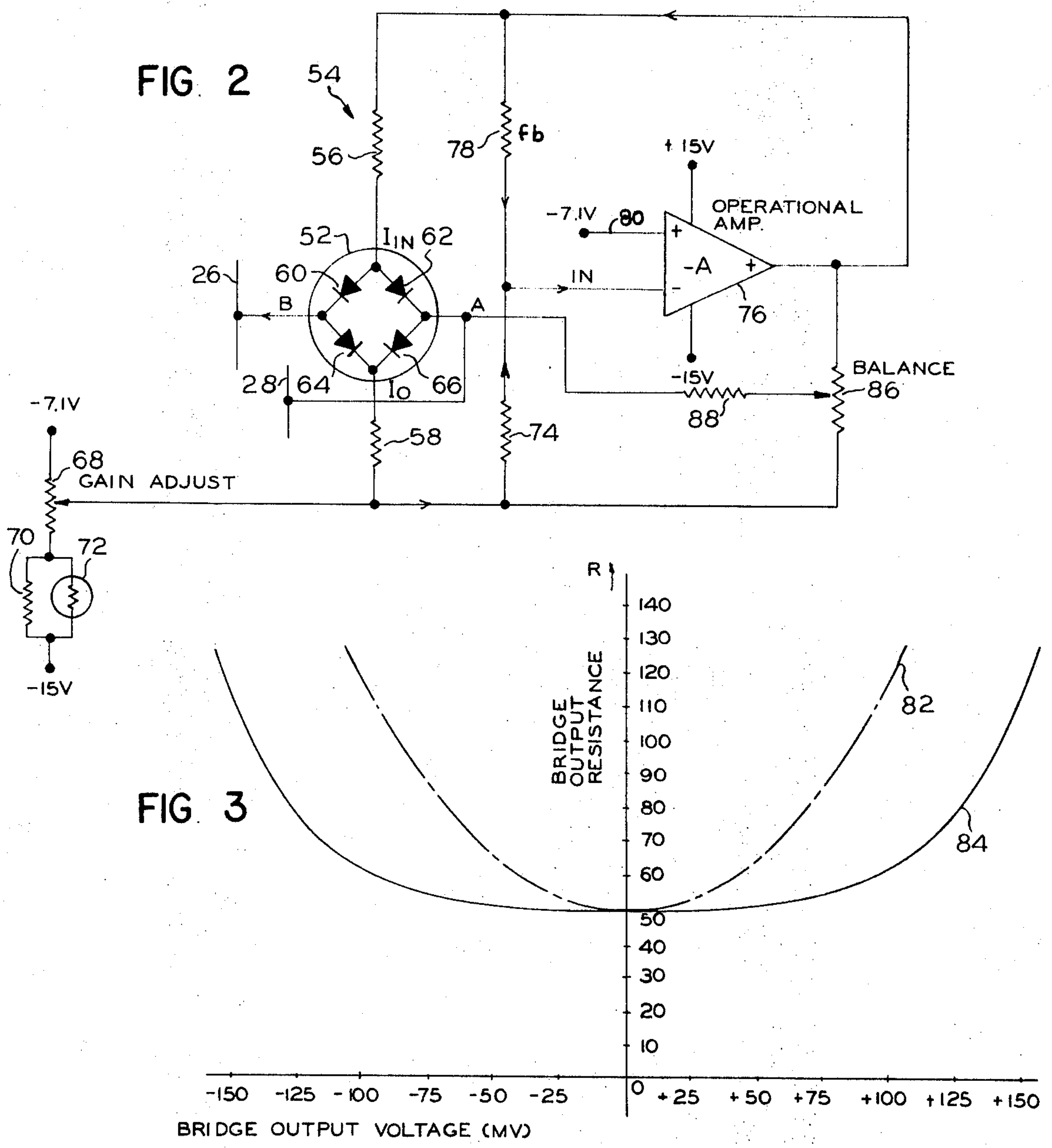
FIG. 2 is a schematic diagram of the gain control circuit employed in the amplifier of FIG. 1.
FIG. 3 is a diagram of the operating characteristic of the diode bridge used in FIG. 2, showing the effect of providing two diodes with rectifying junctions of larger area.

In order to vary the gain of the amplifier, a bridge 52 of unilateral conducting elements, such as diodes, is connected at its output terminals between transmission line conductors 26 and 28 and the input terminals of such bridge are connected to a bias circuit 54 shown in greater detail in FIG. 2. The diode bridge 52 functions as a variable resistance gain control and may be connected to either end of the transmission line so that it is in parallel with the load resistors 23 and 24 to vary the effective output load resistance of the input transistors 10 and 12, or in parallel with the base bias resistors 34 and 36 to vary the effective input resistance of the output transistors 30 and 32. However, it is also possible to connect the diode bridge at some intermediate point within the transmission line. It should be noted that while the diode bridge can change the termination resistance of the transmission line at one end thereof so that it no longer matches the characteristic impedance on the line, this does not effect the transient signal response of the line since its other end is still terminated in its characteristic impedance.

As shown in FIG. 2, the bias current 54 connected to the input or side terminals of the diode bridge 52 includes a pair of bias resistors 56 and 58 of about 3 kilohms each. Bias resistor 56 is connected to the common anode connection of a first pair of bridge diodes 60 and 62 while the other bias resistor 58 is connected to the common cathode connection of a second pair of bridge diodes 64 and 66. The cathode of diode 60 and the anode of diode 64 are connected in common at one bridge output to transmission line conductor 26 while the cathode of diode 62 and the anode of diode 66 are connected in common at the other bridge output to the transmission line conductor 28. A source of variable DC bias voltage is supplied to the bias resistor 58 by the movable contact of a gain adjustment potentiometer 68. One end terminal of the potentiometer 68 is connected to a negative DC voltage source of −7.1 volts and its other end terminal is connected through a voltage divider resistor 70 to a negative DC voltage source of −15 volts. A temperature sensitive device 72, such as a "thermistor," whose resistance varies inversely to that of the bridge diodes with changes in temperature, is connected in parallel with the voltage divider resistor 70 to provide temperature compensation for the bridge diodes in order to control the bias current through such bridge over a range of temperatures so as to maintain the bridge resistance constant. The thermistor 72 has a resistance of 500 ohms at 25° C. while the voltage divider resistor 70 is 820 ohms and the potentiometer is 2 kilohms. The resistance of the thermistor 72 varies with temperature so as to decrease in resistance with an increase in temperature.

The DC bias voltage on the movable contact of potentiometer 68 is also transmitted through a coupling resistor 74 of 15 kilohms to the negative polarity input of an operational amplifier 76 which includes a phase inverter amplifier of high internal gain. The positive polarity output of the operational amplifier is conducted through a feedback resistor 78 of 15 kilohms to the negative input of such amplifier. Since the overall gain of an operational amplifier is determined by the ratio of the feedback resistance to the coupling resistance, the overall gain of the circuit of FIG. 2 is −1. The operational amplifier has a positive polarity input 80 connected to a DC reference voltage of −7.1 volts which is made equal to that of the quiescent DC supply voltage applied to the outputs of the diode bridge at transmission line conductors 26 and 28 through the termination resistors 34 and 36 in the circuit of FIG. 1. As a result of this the operational amplifier acts as a difference amplifier and the output voltage, $e_o$, of the operational amplifier is given by the formula: $e_0=-[R_2/R_1]e_1+[R_1+R_2/R_2]e_2$, where $e_1$ is the negative input voltage, $e_2$ is the positive input voltage of 7.1 volts, $R_1$ is the coupling resistance of 15 kilohms, and $R_2$ is the feedback resistance of 15 kilohms. Therefore, $e_o=-e_1+2e_2=-e_1-14.2$. Thus when the movable contact of the gain control potentiometer 68 is adjusted to apply a bias voltage of −8.1 volts to bias resistor 58, such voltage is also applied to the negative input of operational amplifier 76 as an $e_1$ of −8.1 volts to produce an output voltage $e_o$ of −6.1 volts because $e_0=8.1-14.2=-6.1$ volts. The −8.1 volts applied to bias resistor 58 represents a potential difference of −1.0 volt with respect to the 7.1 volts DC output voltage of the bridge while the −6.1 volts applied to the bias resistor 56 is a potential difference of +1.0 volt with respect to such output voltage. As a result, the bias current flowing in both bias resistors is the same since they are of equal resistance. Thus any change in the bias voltage across the bias resistor 58 is automatically accompanied by a similar change in the opposite direction across bias resistor 56 due to the action of the operational amplifier 76. This also means that the DC bias current flowing through bias resistor 56 always equals the DC bias current flowing through bias resistor 58 so that none of such bias current flows from the outputs of the bridge into the transmission lines 26 and 28.

The bridge diodes are quiescently biased conducting in the linear resistance portion of their operating characteristic. However the amplifier signal applied to the bridge through the transmission line conductors 26 and 28 may be of sufficient amplitude to cause the diodes to be driven into a nonlinear region of operation and change the diode resistance. As shown in FIG. 3, the output resistance vs. output voltage characteristic 82 of the diode bridge when four identical diodes are employed has a linear resistance portion of 50 ohms extending only about 12.5 millivolts on either side of the resistance axis. Thus when the amplifier voltage applied to the output of the bridge exceeds 12.5 millivolts, the resistance of the bridge is no longer constant for a given bias current but increases in a parabolic manner as shown by curve 82. For the particular values of curve 82, it should be noted that the DC bias current flowing through the bridge was about 2 milliamperes.

In order to increase the linear resistance portion of the bridge, diodes 62 and 66 are made with rectifying junction areas about four times that of diodes 60 and 64 and the resulting characteristic curve 84 of such bridge is shown in FIG. 3. The curve 84 has a resistance portion which remains constant at about 50 ohms over a much wider range of amplifier voltages from +62.5 to −62.5 millivolts. This represents an increase in operating range of about 100 millivolts over the bridge of curve 82. A bias current of about 3.11 milliamperes flowed through the diode bridge to give curve 84.

In order to overcome any imbalance in the diode bridge due to different resistances in diodes 60 and 64 or different resistances in diodes 62 and 66, a balance potentiometer 86 of 100 kilohms is provided with its end terminals connected across the bias resistors 56 and 58 and its movable contact connected through a coupling resistor 88 of 100 kilohms to one of the output terminals of the bridge.

The bridge diodes may be conventional PN junction semiconductor diodes, however for best performance at high frequencies, Schottky barrier diodes having metal to semiconductor rectifying junctions are employed because they have less charge storage.

It will be obvious to those having ordinary skill in the art that many changes may be made in the above-described details of the preferred embodiment of the present invention. For example, the gain control circuit of the present invention may be employed in other amplifiers than the push-pull amplifier of FIG. 1 including a single ended amplifier as long as the two output terminals of the bridge are at the same DC supply voltage potential. Therefore the scope of the present invention should only be determined by the following claims.

I claim:

1. A direct coupled amplifier circuit having a variable gain, the improvement comprising:

gain control means including a diode bridge connected at its output to the amplifier for varying the gain of said amplifier in response to changes in the resistance of said bridge;

said bridge including a pair of first diodes having their cathodes connected in common at one input of the bridge and a pair of second diodes having their anodes connected in common at another input of said bridge, and with the anodes of one of said first diodes connected in common with the cathode of one of said second diodes at each of the outputs of said bridge; bias means connected to the inputs of said bridge for supplying a bias current through said diodes so that they are quiescently biased conducting in a substantially linear region of their operating characteristic, and for changing the bias voltage applied to said inputs equally in opposite directions and thereby varying the bias current to change the resistance of said bridge between its outputs while maintaining the quiescent DC output voltage level of said bridge constant;

said bias means including a pair of bias resistors each having one terminal connected to a different one of the inputs of said bridge, and variable bias voltage means for applying different bias voltages to the other terminals of said bias resistors and for varying said bias voltages in such a manner as to maintain the voltage drop between one bridge input and the bridge outputs equal to the voltage drop between the other bridge input and said bridge outputs in order to cause the same bias current to flow through each bias resistor and to prevent any of said bias current from flowing through the outputs of the bridge; and said variable bias voltage means including an operational amplifier means formed by a phase inverter amplifier of high internal gain having a first input connected through a coupling resistor to the common terminal of one bias resistor and the output of a variable DC voltage source, said inverter amplifier having its output connected to the other bias resistor, and a negative feedback resistor connected from the output to the input of the inverter amplifier.

2. An amplifier circuit in accordance with claim 1 which includes reference means for applying a DC reference voltage to a second input of the operational amplifier of the polarity as its output, said reference voltage being approximately equal to the quiescent DC supply voltage on the outputs of said bridge.

3. An amplifier circuit in accordance with claim 2 in which the variable DC voltage source includes a potentiometer connected at its end terminals to different DC voltages having its movable contact connected as the output of said voltage source and having one end terminal connected to a source of DC voltage equal to said reference voltage.

4. An amplifier circuit in accordance with claim 3 which also has a temperature compensation means including the parallel impedance of a voltage divider resistor, connected between the other end terminal of the potentiometer and the other source of DC voltage.

5. An amplifier circuit in accordance with claim 4 which also has a bridge balance means including another potentiometer connected at its end terminals across the series circuit of the bias resistors and the bridge with the movable contact of said other potentiometer connected to one of the outputs of said ridge.

6. A direct coupled amplifier circuit having a variable gain, the improvement comprising:

gain control means including a diode bridge connected at its output to the amplifier for varying the gain of said amplifier in response to changes in the resistance of said bridge;

said bridge including a pair of first diodes having their cathodes connected in common at one input of the bridge and a pair of second diodes having their anodes connected in common at another input of said bridge, and with the anode of one of said first diodes connected in common with the cathode of one of said second diodes at each of the outputs of said bridge;

said first and second pairs of diodes having one diode with a much larger rectifying junction than the other diode of the pair, and the two diodes of similar large area junctions are connected in common to one of the bridge outputs; and bias means connected to the inputs of said bridge for supplying a bias current through said diodes so that they are quiescently biased conducting in a substantially linear region of their operating characteristic, and for changing the bias voltage applied to said inputs equally in opposite directions and thereby varying the bias current to change the resistance of said bridge between its outputs while maintaining the quiescent DC output voltage level of said bridge constant.

7. An amplifier circuit in accordance with claim 6 in which the diodes are metal to semiconductor rectifying junction diodes which have little charge storage.

8. A direct coupled amplifier circuit having a variable gain, the improvement comprising:

an input amplifier stage having a pair of push-pull outputs;

an output amplifier stage having a pair of push-pull inputs;

a coupling means coupled said input and output stages, including a first line connected from one push-pull output to one push-pull input and a second line connected from the other push-pull output to the other push-pull input;

gain control means including a bridge of unilateral conducting elements connected at its outputs between said first and second lines for varying the gain of said amplifier circuit in response to changes in the resistance of said bridge;

said bridge including four unilateral conducting elements each having first and second terminals with a pair of first elements having their first terminals connected in common at one input of the bridge and a pair of second elements having their second terminals connected in common at another input of said bridge, and with the second terminal of one of said first elements connected in common with the first terminal of one of said second elements at each of the outputs of said bridge; and bias means connected to the inputs of said bridge for supplying a bias current through said elements so that they are quiescently biased conducting in a substantially linear region of their operating characteristic, and for changing the bias voltage applied to said inputs equally in opposite directions and thereby varying the bias current to change the resistance of said bridge between its outputs while maintaining the quiescent DC output voltage level of said bridge constant.

9. An amplifier circuit in accordance with claim 8 in which the coupling means is a transmission line of substantially uniform characteristic impedance formed by said first and second lines.

UNITED STATES PATENT OFFICE

CERTIFICATE OF CORRECTION

Patent No. 3,582,807 Dated June 1, 1971

Inventor(s) John L. Addis

It is certified that error appears in the above-identified patent and that said Letters Patent are hereby corrected as shown below:

In column 3, line 52, "7.1" should be -- -7.1--.

In column 5, line 27, "ridge" should be --bridge--.

Signed and sealed this 28th day of September 1971.

(SEAL)
Attest:

EDWARD M.FLETCHER,JR.
Attesting Officer

ROBERT GOTTSCHALK
Acting Commissioner of Patents